United States Patent [19]

Zimmer et al.

[11] Patent Number: 5,763,879
[45] Date of Patent: Jun. 9, 1998

[54] DIAMOND PROBE TIP

[75] Inventors: Jerry W. Zimmer, Saratoga; Daniel A. Worsham, San Jose, both of Calif.

[73] Assignees: Pacific Western Systems; SP3, both of Mountain View, Calif.

[21] Appl. No.: 714,606

[22] Filed: Sep. 16, 1996

[51] Int. Cl.$^6$ .................................................. H02J 37/26

[52] U.S. Cl. .................. 250/306; 250/307; 73/105; 324/715; 324/717; 324/718; 324/719; 324/722; 324/724; 324/754; 324/757; 324/758; 324/765; 428/408; 428/457

[58] Field of Search ......................... 250/306, 307; 428/408, 457; 73/105; 324/715, 717, 718, 719, 722, 724, 754, 757, 758, 765

[56] References Cited

U.S. PATENT DOCUMENTS

| | | | |
|---|---|---|---|
| 4,943,720 | 7/1990 | Jones | 250/306 |
| 5,010,249 | 4/1991 | Nishikawa | 250/306 |
| 5,270,543 | 12/1993 | Visser et al. | 250/306 |
| 5,383,354 | 1/1995 | Doris et al. | 250/306 |
| 5,585,734 | 12/1996 | Meuris et al. | 250/306 |

*Primary Examiner*—Archene Turner
*Attorney, Agent, or Firm*—Thomas Schneck; John P. McGuire, Jr.

[57] ABSTRACT

A probe for electrical contact with a metal layer of an integrated circuit wherein the probe features a polycrystalline diamond layer coating a fine conductive wire. The diamond coating has exposed pyramidal facets having a density of at least 2000 per square millimeter. The substrate has a radius exceeding one micrometer.

9 Claims, 4 Drawing Sheets

DIAMOND PROBE TIP

TECHNICAL FIELD

The invention relates to probe apparatus for electrical testing of integrated circuits by direct electrical contact.

BACKGROUND ART

In testing integrated circuits for electrical performance characteristics, automatic test equipment employing one or more probe cards is frequently used. The probe card is a circuit board having a central hole from which conductive traces extend to the periphery of the card and fine conductive wires, known as probe wires or merely probes, are supported from the edge of the hole to radially converge toward the interior of the hole in an angularly downward direction. On the radially outward ends, these probes make contact with the conductive traces to carry electrical signals generated by test equipment connected to the probe card. On the radially inward ends, the probes have sharp tips which can contact regions of integrated circuits under test. The probes carry signals from a semiconductor integrated circuit or chip under test to and from the automatic test equipment.

Most probes are merely tungsten wire which is formed to a desired shape. Tungsten wire can be made fine enough to contact very small chip areas, yet is sufficiently self-supporting to be formed into desired shapes with a shape retention quality. Tungsten is also very durable, makes good electrical contact and is readily available. A tungsten wire can be sharpened to a point by grinding and/or chemical etching and/or electrochemical etching, giving the wire a greater chance of penetrating tough oxide films which cover metal layers to which contact is desired. Typically, radially extending probes mounted on a probe card are brought into contact with portions of a chip. The probes physically contact the chip and scratch the upper oxide layer, an electrically insulative layer, for a distance sufficient to reach underlying metal conductor. Scratching the upper layer of oxide has always been a part of chip testing, but can sometimes inadvertently cause damage to a chip if the scratch penetrates beyond an underlying metal layer.

As the size of integrated circuits shrinks, it has become more difficult to establish electrical contact with the upper metal layer of a chip because there is insufficient room to allow a tungsten tip to scratch away oxide covering the metal layer in some instances.

In the field of scanning tunnelling microscopes diamond probe tips are known. These tips do not physically contact a specimen, but come very close. The object is to allow electrons from a surface to reach the tip by quantum mechanical tunnelling. In order to do this the probe tip must be extremely sharp in order to provide the high electric field necessary for tunnelling. In U.S. Pat. No. 5,010,249 A. Nishikawa describes a probe tip for a scanning tunnelling microscope where sharpness is achieved by forming a carbon film mixed with a columnar diamond crystal and an amorphous carbonic component. The protruding columnar crystal is exposed by selective etching of the amorphous carbonic component. The acutely sharp probe tips are said to improve tunnelling microscopy. However, such tips would not be suitable for probe cards because the very sharp tips would break or might dig not only through the oxide layer of a chip, but also through the metal layer and perhaps reach the underlying substrate, perhaps damaging an integrated circuit.

An object of the invention is to provide a probe tip of improved wear characteristics and longer life, yet which makes good contact with the upper metal layer of a chip with very little scratching and without risk of damaging the underlying substrate or metal layer. Summary of invention The above object has been achieved with a probe tip wherein a dense array of conductive diamond crystals are provided on a gently rounded wire substrate. These crystals have very sharp apexes which can easily penetrate thin oxide layers on the metal pads on the chip without substantial scratching and without risk of penetrating through the pad metal layer. At the same time good electrical contact is made because of the multiplicity of contact points and the conductive nature of the diamond.

The tip is formed by mechanically shaping a wire to a frustro-conical shape which is then chemically etched to achieve a gently rounded shape, having a radius greater than one micron. The etched tip is then placed in a heated chemical deposition reactor where a carbon bearing gas, such as methane, is introduced in the presence of a graphite etchant such as atomic hydrogen. In addition a dopant source gas, such as $B_2H_6$ (diborane), must be present to insure that the diamond film is sufficiently conductive. The gas is pyrolyzed or otherwise cracked to yield carbon, which precipitates out of the gaseous form as diamond. A conductive polycrystalline diamond film is deposited on the tip with exposed pyramidal facets having a density of at least two thousand per square millimeter.

The underlying substrate of the new probe is still tungsten or other refractory metal or refractory metal alloy so the probe can be formed in a desired shape, as previously. On the other hand, the unsupported tip or free end of the probe has a high density of diamond facets which allow non-destructive contact with the metal of a semiconductor chip through an overlying oxide layer. The facet density is sufficient so that at least three-point contact can be made with a metal layer of the chip. Such three-point contact provides mechanical stability for the probe, while at the same time insuring that the probe resists digging too far into the metal of the chip. Probes of the present invention can be supported in two ways. In one approach, prior art probe wire holders may be used to mount the probe tip of the present invention. In another approach a prior art probe card may have probe wires coated with diamond film in accord with the present invention.

BEST MODE FOR CARRYING OUT THE INVENTION

Figure 1:
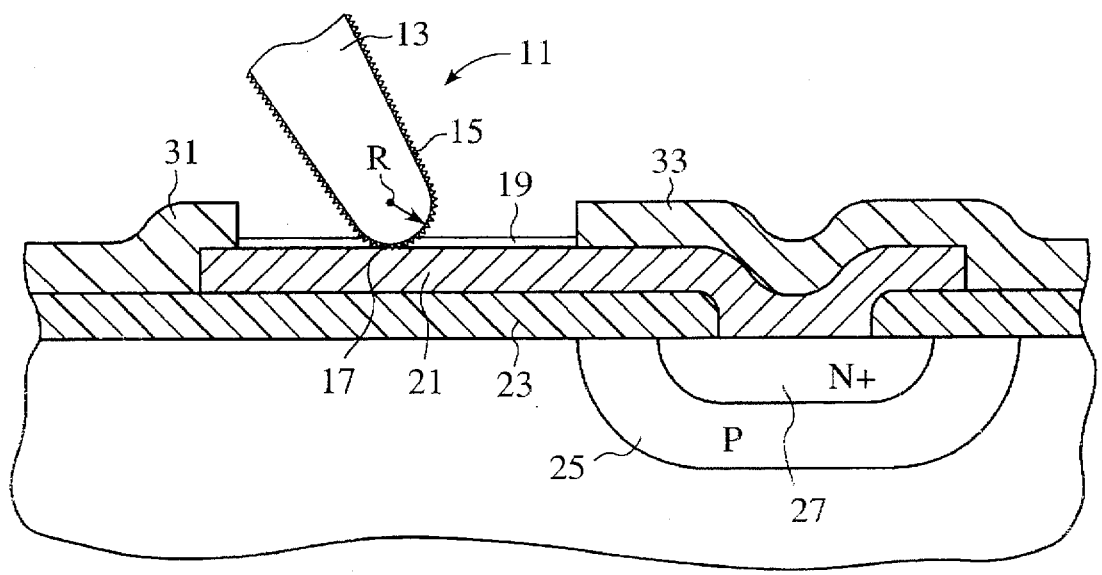
FIG. 1 is a side plan view of a probe tip in accord with the present invention in contact with a portion of a semiconductor integrated circuit chip.

With reference to FIG. 1, a probe tip 11 is shown having a substrate 13 and a polycrystalline diamond film coating 15.

At least three facets 17 of the tip penetrate an oxide layer 19 to make contact with an aluminum layer 21 of a semiconductor device, such as a transistor under fabrication or test. The aluminum layer overlies another oxide layer 23 which insulates a metal layer 21 from active region 25, but not active area 27. The metal layer 21 makes contact with active region 27 and can transmit signals to and from a device formed by the active areas. Note that the oxide layer 19 is very thin, typically ranging from between 5–10 Angstroms to 20–30 Angstroms. The oxide region is usually defined between thicker oxide regions 31 and 33. Sometimes the opening provided between the thick oxide vertical walls is only a few 10's of microns. If tip 11, having a radius R of at least one micron, is small enough to fit into the window between the thick oxide layers, an ideal relationship is established such that the sharp diamond facets can penetrate the oxide layer 19 without damaging the underlying metal 21 or other underlying layers. A diamond film tip in accord with the present invention is prepared as follows.

Figure 2:
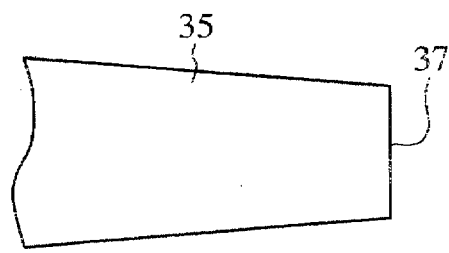
FIGS. 2–6 are side views of steps for forming a probe tip in accord with the present invention.
Figure 3:
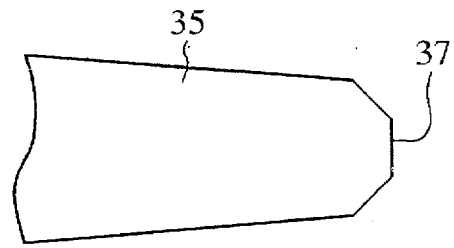

With reference to FIG. 2, a length of tungsten wire 35 is cut with a blunt end 37 to be shaped as the desired tip substrate. The blunt end has a taper of a few degrees. In FIG. 3, the blunt end 37 is mechanically shaped, such as by abrasion with a whetstone. The tip is shaped to a frustroconical shape, with inclined sides at an angle of about 45 degrees to the axis of the wire. This mechanical working of the wire tends to eliminate any defects. Any grains of the wire which have been split are abraded.

Figure 4:
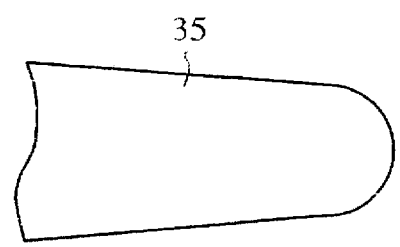
Figure 5:
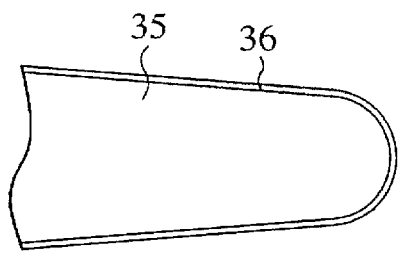

Next the wire is electrochemically etched in a solution of sodium hydroxide. A voltage is applied to the wire causing an electrochemical reaction wherein the tip is etched to a round shape shown in FIG. 4, with a body taper of 4 to 5 degrees from the axis.

Figure 6:
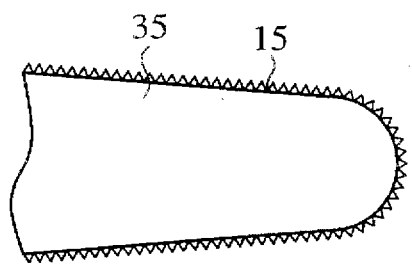

Next the wire is placed in a hot filament reactor at a temperature of approximately 700° to 1200° C. The reactor is open to gas flow of a carbon bearing gas, such as methane, in the presence of hydrogen. A dopant source containing boron is also present in the reactor. This causes the formation of a conductive polycrystalline diamond film coating 15, seen in FIG. 6. Some of the hydrogen gas is dissociated into atomic hydrogen and etches any graphite deposited on the substrate without attacking the diamond, causing the deposition of carbon which self-organizes into diamond crystals. The reactor conditions may be adjusted so that the principal deposition of the diamond film is in the form of pyramids having a 1-1-0 or 1-1-1 crystal orientation, with a density of at least 2000 facets per square millimeter. Different reactors may form the deposition at different temperatures, depending on the type of the reactor. A preferred reactor is a tungsten wire array reactor, long known in the diamond film industry. The desired diamond film can then be coated with a thin conductive film such as platinum or gold which will enhance the overall conductivity of the probe. The coating may be plated, sputtered, or evaporated.

Figure 7:
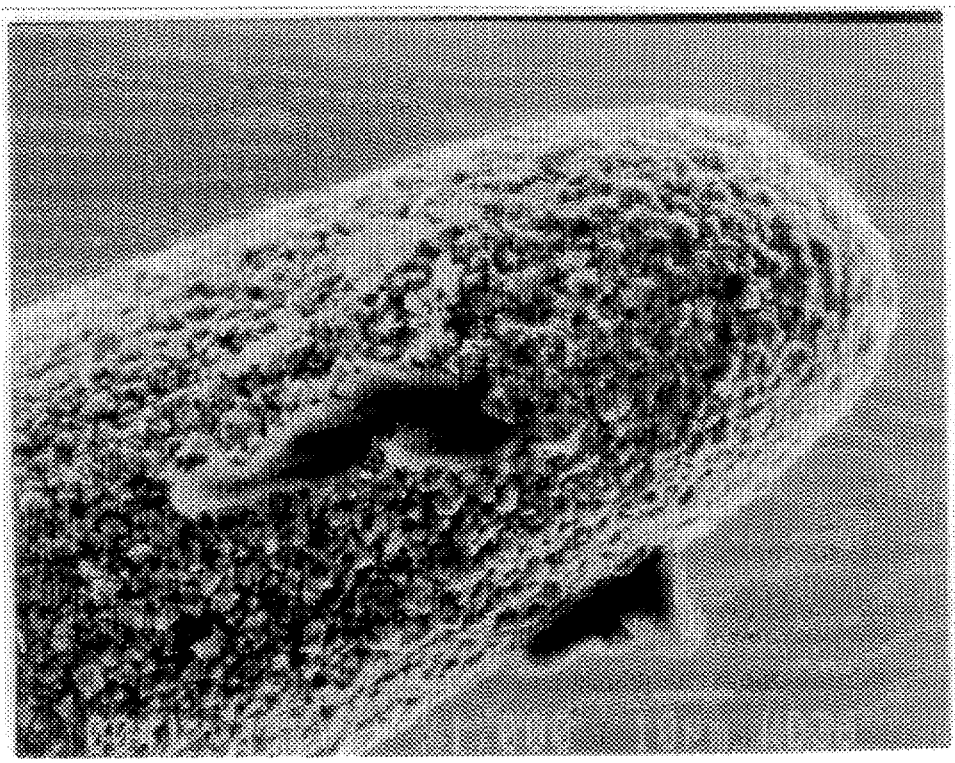
FIG. 7 is a microphotograph of a probe tip in accord with the present invention, enlarged 1000 times from actual size.
Figure 8:
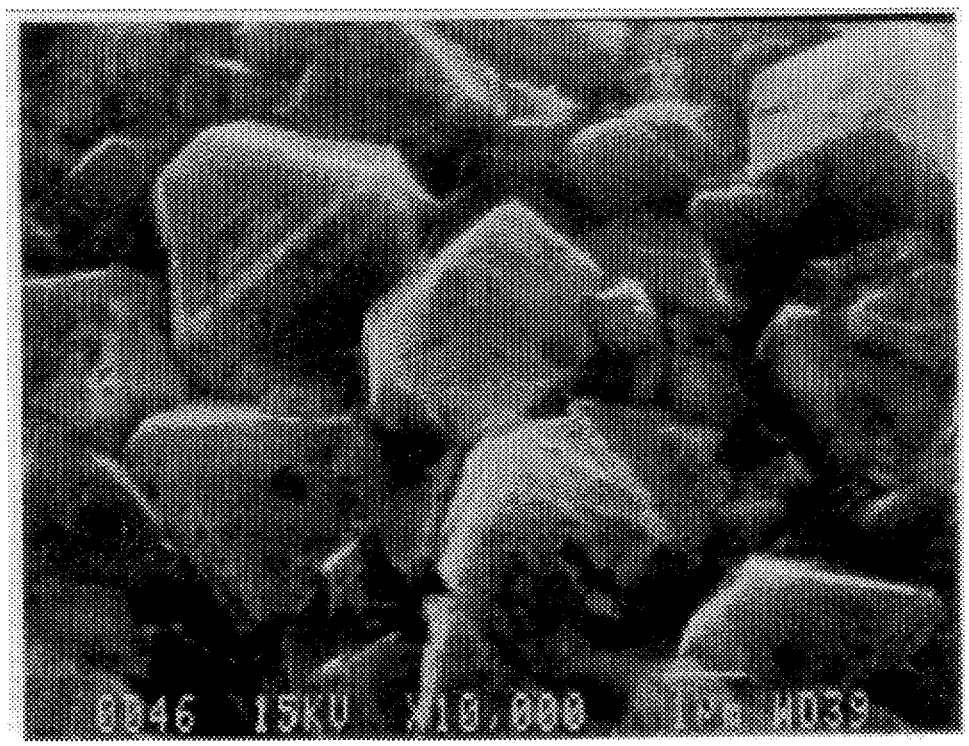
FIG. 8 is a microphotograph of a portion of the probe tip of FIG. 8 enlarged 10,000 times from actual size.

The microphotograph of FIG. 7 shows the facets with a density described above, i.e. greater than 2000 per square millimeter. This will provide sufficient abrasion to an oxide or nitride surface to allow surface contact to an underlying chip layer, without wearing away the layer. Since diamond does not oxidize, no preparation of new tips, such as cleaning, is necessary. The enlargement of FIG. 8 shows the general regularity of facets, which have a grain size of between 5 and 100 square microns.

As mentioned previously, there are two principal ways to use the probe tips of the present invention. A first way is to mount straight wires having diamond film end tips of the type shown and described with reference to FIG. 6. The overall length of the wire would be approximately one inch, but only the tip needs the diamond film described above.

Figure 9:
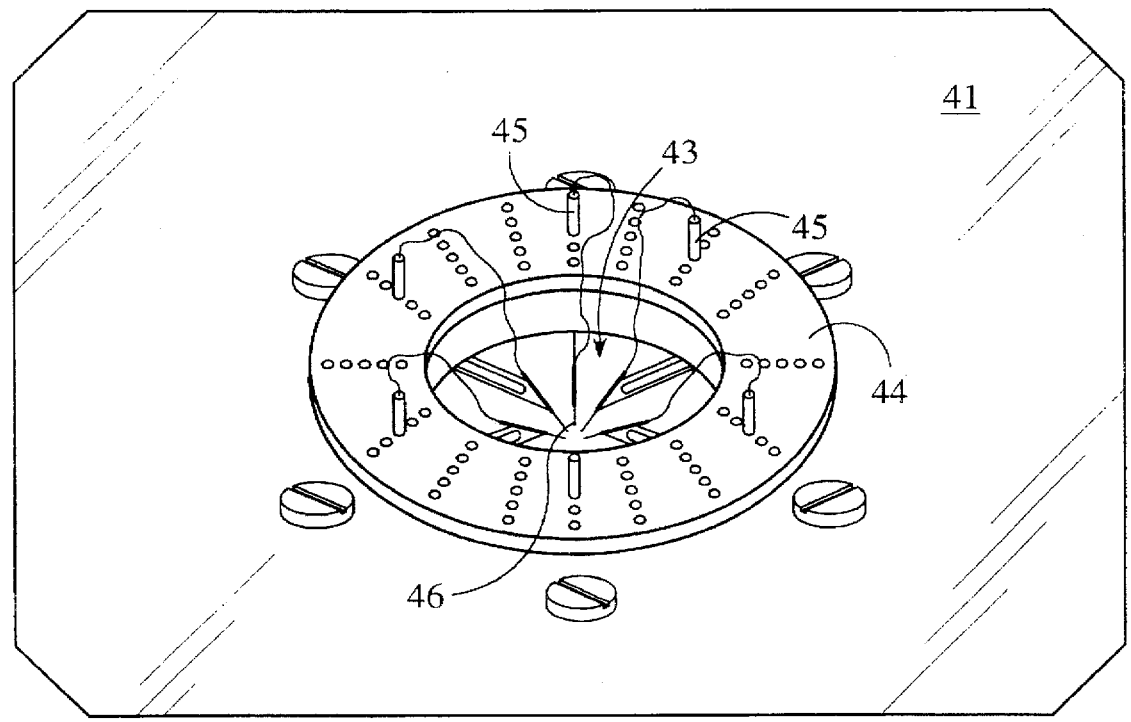
FIG. 9 is a top perspective view of a holder of probe tips of the present invention.

In FIG. 9, a metal support plate 41 has a central aperture 43 large enough for optical inspection of a test object, such as a wafer, on the underside of the plate. A typical diameter for the aperture would be several inches for inspection of a large portion of a wafer which is robotically supported in a vacuum chuck below the aperture. On an upper side of the plate electrical test terminals 45 are mounted on an annular disk 44, which in turn is mounted in spaced apart relation from the plate 41 by insulative stand-off upright posts, not shown. Test terminals 45 serve to route electrical wires from automated test equipment to the wire probes 46 which extend radially inwardly at the center of central aperture 43.

Figure 10:
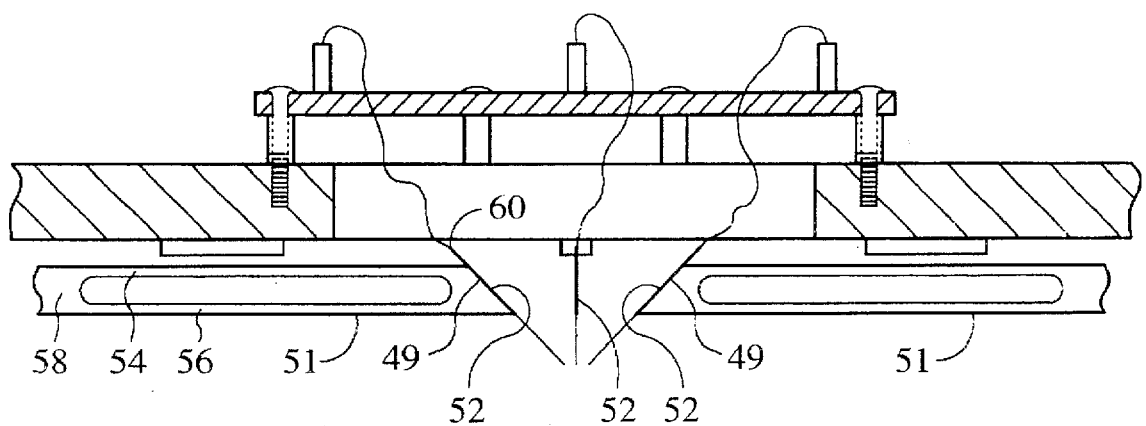
FIG. 10 is a bottom perspective view of the apparatus of FIG. 9.

With reference to FIG. 10, on the opposite side of the support plate, elongated wire holders 51 are seen to be radially mounted about the aperture, like spokes on a wheel. There are many different types of probe wire holders known in the prior art, including those shown in FIG. 10 and many can serve the intended purpose. Each holder 51 has a forward sloping nose 49 to which probe wires are adhered. The nose 49 is supported by a cantilever 2 having a lengthwise spring, allowing up and down flexing of the cantilever and of the attached probe wire. The cantilever is formed of two generally parallel leafs 54 and 56 which are united at the nose 49 in the forward direction as well as at a rearward region 58. Flexing of the cantilever is needed so that the probe tip supported at the nose will be able to move away from a surface where there is a high resistance to surface contact by the probe tip, thereby keeping the tip from digging into the surface beyond a permissible level. The permissible level should be adjustable and so the support plate carries set screws for biasing the leafs to a desired extent. A bias spring, not shown, keeps the cantilever in a neutral position, but allows flexing of the cantilever.

The distant end 60 of the probe wires has an electrical terminal connected by a conductive wire to the electrical test terminal. The radial positions of the cantilevers are adjustable so that the plurality of cantilevers may be disposed to make contact with desired regions of a wafer, for example the upper metal layers of transistors or perhaps contact pads of a chip. The wafer is raised by a vacuum chuck or gripper so that the radial array of probe tips comes into contact with desired portions of a chip or wafer. Sometimes the chip or wafer is heated during testing to temperatures on the order of 280° C. as established by test protocols. Slight scratches induced by sliding contact of diamond facets through an oxide layer and onto a metal layer may be subsequently hidden by overlying bonding to the metal, for example by a thermal compression bond, joining a conductive member to a chip. The slight scratches are necessary in order to obtain electrical data from the chip, but hiding the scratches is desirable to prevent unwanted electrical effects or to prevent contamination.

Figure 11:
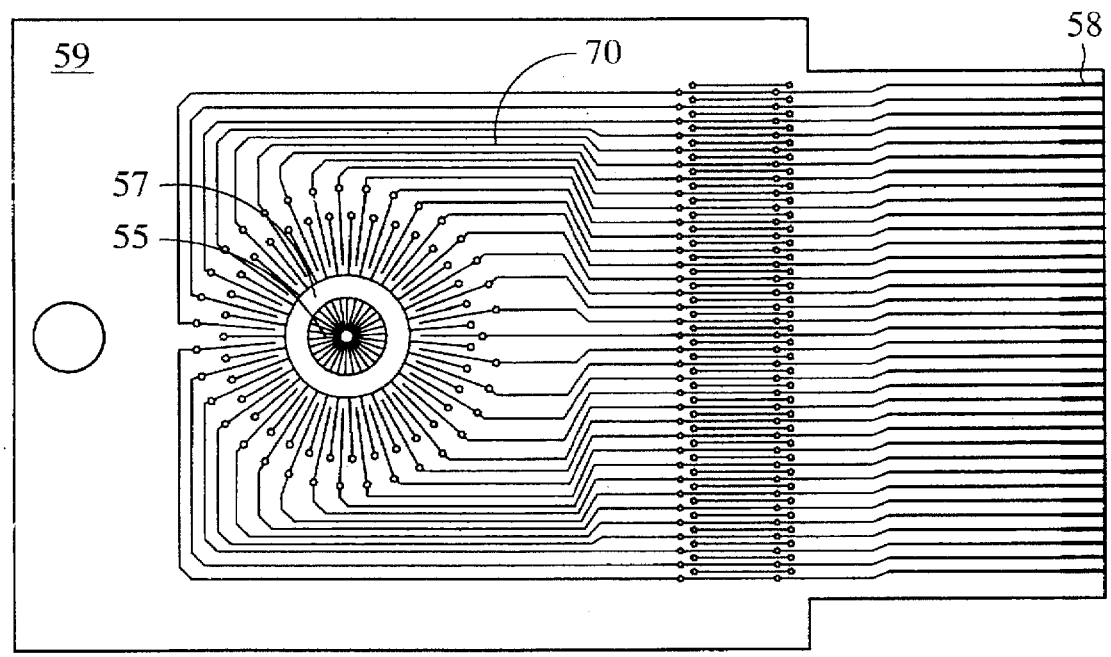
FIG. 11 is a bottom perspective view of a probe card holder for the probe tips of the present invention.

Another way to use the probe tips of the present invention is in a probe card, as shown in FIG. 11. A probe card 59 is a printed circuit card having conductive wires or traces 70 laid out on the board. There is a central aperture in the board for viewing an underlying object to be tested. The conductive wires or traces extend radially inwardly to the central aperture on the underside of the board. Diamond film probe wires of the present invention are joined to the radially inward ends of the conductive wires or traces.

In FIG. 11, the probe wires 55 are held in place by annular clamping member 57 on the underside of a probe card 59.

The probe card is usually held fixed and a wafer chuck presents an upper surface of a wafer or chip to the underside of the probe card. The free ends of the conductive wires are treated with diamond film, as described above. The probe card 59 is manufactured to mate directly with automated test equipment through terminals 58 at the edge of the card.

In manufacturing tips for a probe card, the probe wires are held in a parallel manner within a fixture having grooves to receive the wires. The grooves are covered with a flat plate which masks the main body of the wires, but leaves the tips exposed. The fixture is placed in a heated CVD reactor where the diamond film is deposited on the exposed tips as described above. After deposition the wires are removed from the fixture and mounted on the probe card in a spoke-like pattern and the clamping member secured in place after the wires are in the desired positions. The probe wires will generally contact a chip or wafer at a shallower angle than the angle of the holder of FIG. 9. The angle of tips held on a probe card is generally less than 30 degrees to the horizontal, while the angle of the tips held in the holder of FIG. 8 is approximately 45 degrees to the horizontal. However, electrically, the tips behave in the same manner in contacting a chip, wafer or device under test.

We claim:

1. A probe for electrical contact with a metal layer of an integrated circuit of the type having a semiconductor substrate with overlying layers of different materials including an upper metal layer coated with an oxide layer comprising, a fine conductive wire substrate having a supported end and a free end, the free end rounded to a radius exceeding one micrometer, the free end having a conductive polycrystalline diamond layer coating with exposed pyramidal apexes having a density of at least 2000 per square millimeter.

2. A probe for electrical contact with a metal layer of an integrated circuit of the type having a semiconductor substrate with overlying layers of different materials including an upper metal layer coated with an oxide layer, the probe made by the process comprising, mechanically shaping the tip of a conductive wire to a frustro-conical shape, chemically etching said tip of the wire to a smoothly rounded surface having a radius exceeding one micrometer, introducing the etched tip to a heated reactor having molecular hydrogen and a carbon bearing gas flowing and a dopant source therein at a temperature conducive to the formation of a conductive polycrystalline diamond layer on the tip with exposed pyramidal apexes having a density of at least 2000 per square millimeter.

3. The probe of claim 2 wherein said crystal facets have a 1-1-0 or 1-1-1 crystal orientation.

4. A probe card for testing integrated circuit chips comprising, a printed circuit card having a plurality of traces extending outwardly from a central opening, a plurality of elongated probes having a wire cross-sectional dimension, each probe with a supported end joined to the card and a free end radially inward of the opening with a rounded tip coated with a conductive diamond film layer having exposed pyramidal apexes.

5. The probe card of claim 4 wherein the free end of the probe has a radius of greater than one micrometer.

6. The probe card of claim 5 wherein the pyramidal apexes have a density of at least 2000 per square millimeter.

7. The probe card of claim 5 wherein each probe is joined to the probe card by a piezoelectric transducer for causing flexing of the probe toward an integrated circuit chip to be tested.

8. The probe card of claim 4 wherein the number of probes is at least three.

9. The probe card of claim 4 wherein each probe has a tungsten wire substrate.

* * * * *